(12) United States Patent
He et al.

(10) Patent No.: US 10,153,342 B1
(45) Date of Patent: Dec. 11, 2018

(54) SEMICONDUCTOR DEVICE

(71) Applicant: UNITED MICROELECTRONICS CORP., Hsinchu (TW)

(72) Inventors: Wan-Xun He, Singapore (SG); Kui Mei, Singapore (SG); Su Xing, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/794,065

(22) Filed: Oct. 26, 2017

(30) Foreign Application Priority Data

Sep. 20, 2017 (CN) .......................... 2017 1 0854658

(51) Int. Cl.
| | |
|---|---|
| *H01L 29/06* | (2006.01) |
| *H01L 29/423* | (2006.01) |
| *H01L 29/10* | (2006.01) |
| *H01L 29/49* | (2006.01) |
| *H01L 29/08* | (2006.01) |

(52) U.S. Cl.
CPC ...... *H01L 29/0692* (2013.01); *H01L 29/0649* (2013.01); *H01L 29/0847* (2013.01); *H01L 29/1033* (2013.01); *H01L 29/42376* (2013.01); *H01L 29/4916* (2013.01)

(58) Field of Classification Search
CPC ............. H01L 29/0692; H01L 29/0649; H01L 29/0847; H01L 29/1033; H01L 29/42376; H01L 29/4916
See application file for complete search history.

(56) References Cited

U.S. PATENT DOCUMENTS

| | | |
|---|---|---|
| 5,065,206 A | 11/1991 | Nishizawa et al. |
| 6,331,726 B1 | 12/2001 | Voldman |
| 6,998,682 B2 | 2/2006 | Chan et al. |
| 7,038,276 B2 | 5/2006 | Ker et al. |
| 7,061,029 B1 | 6/2006 | Lee et al. |
| 7,485,925 B2 | 2/2009 | Chen |
| 8,072,030 B2 | 12/2011 | Sugiura |
| 8,362,562 B2 | 1/2013 | Okihara |
| 2017/0025510 A1* | 1/2017 | Takeuchi .......... H01L 29/42316 |

* cited by examiner

*Primary Examiner* — Karen Kusumakar
(74) *Attorney, Agent, or Firm* — WPAT, PC

(57) ABSTRACT

A semiconductor device includes a substrate; an active layer disposed over the substrate and having a source region and a drain region; a contact region disposed over the substrate; a gate structure disposed over the active layer, wherein the gate structure includes a middle portion and a lateral portion connecting to the middle portion, and the lateral portion has a snake shape.

9 Claims, 2 Drawing Sheets

SEMICONDUCTOR DEVICE

This application claims the benefit of People's Republic of China application Serial No. 201710854658.2, filed on Sep. 20, 2017, the subject matter of which is incorporated herein by reference.

BACKGROUND

Technical Field

The disclosure relates in general to a semiconductor device, and more particularly to a semiconductor device having a silicon on insulator (SOI) structure.

Description of the Related Art

In recent years, a semiconductor device having a silicon on insulator (SOI) structure is in great demand for its low power consumption and high performance. While manufacturing the semiconductor device, a dopant may be applied to a gate of the SOI structure. However, if too much dopant is diffused to a working region of the gate of the semiconductor device, the performance of the semiconductor device may be degraded.

SUMMARY

The disclosure is directed to a semiconductor device, and a gate structure thereof has a lateral portion having a snake shape and a plurality of bending portions. Therefore, during applying a dopant to the gate structure of the semiconductor device, under the same requirement to the size of the semiconductor device, the length of the path for the dopant to diffuse into the gate structure can be increased, so that a rapid diffusion of the dopant having a high concentration into the working region of the gate structure can be avoided, the interference of the dopant to the working region of the gate structure can be reduced, and the performance of the semiconductor device can be improved.

According to one aspect of the present disclosure, a semiconductor device is provided. The semiconductor device includes a substrate; an active layer disposed over the substrate and having a source region and a drain region; a contact region disposed over the substrate; a gate structure disposed over the active layer, wherein the gate structure includes a middle portion and a lateral portion connecting to the middle portion, and the lateral portion has a snake shape.

The above and other aspects of the invention will become better understood with regard to the following detailed description of the preferred but non-limiting embodiment(s). The following description is made with reference to the accompanying drawings.

Figure 1:
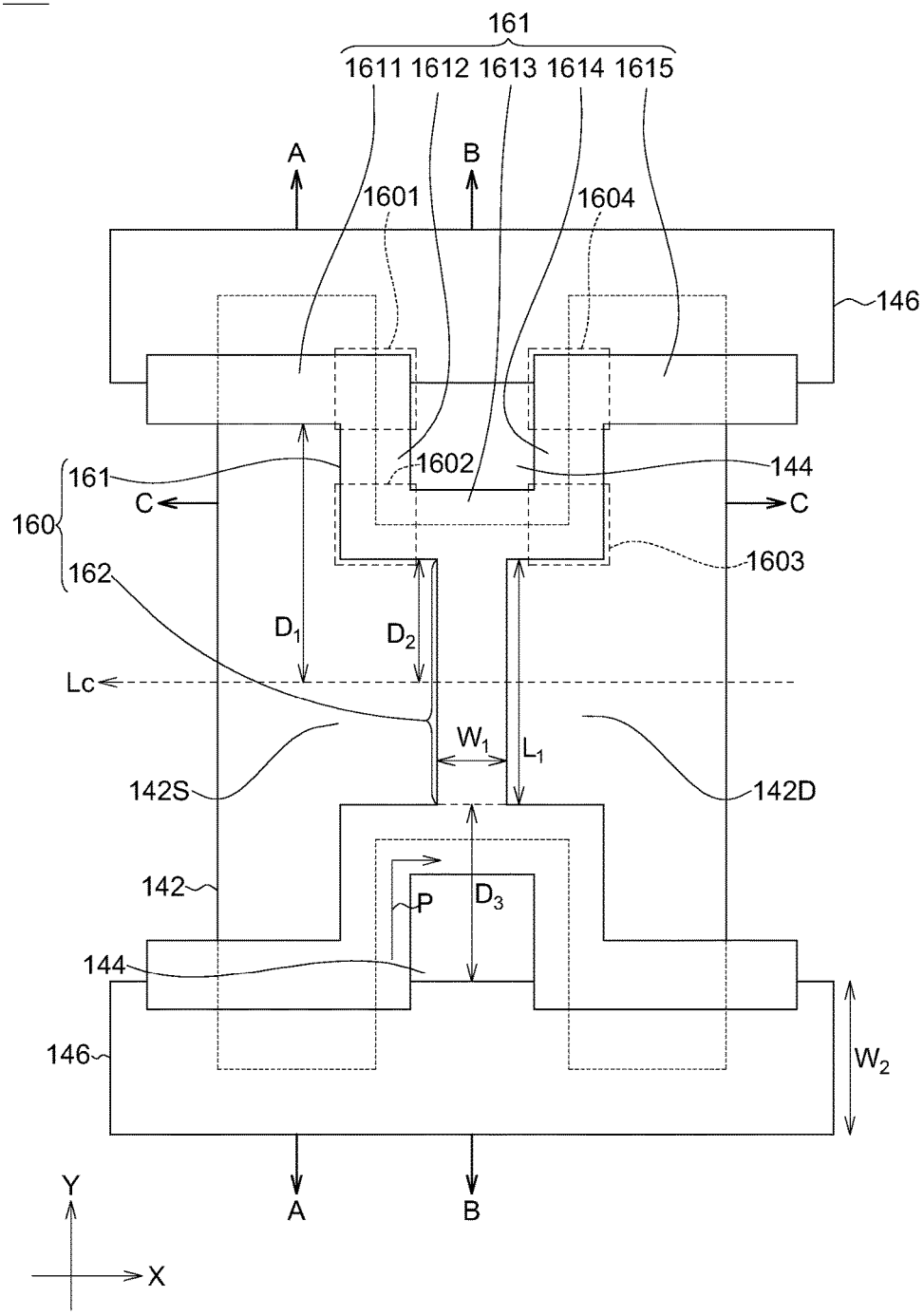
FIG. 1 illustrates a top view of a semiconductor device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The disclosure provides a semiconductor device, and a gate structure of the semiconductor device has a lateral portion having a snake shape and a plurality of bending portions. Therefore, during applying a dopant to the gate structure of the semiconductor device, under the same requirement to the size of the semiconductor device, the length of the path for the dopant to diffuse into the gate structure can be increased, so that a rapid diffusion of the dopant having a high concentration into the working region of the gate structure can be avoided, the interference of the dopant to the working region of the gate structure can be reduced, and the performance of the semiconductor device can be improved.

FIG. 1 illustrates a top view of a semiconductor device 100 according to one embodiment of the disclosure. The semiconductor device 100 can be applied to a p-type Metal-Oxide-Semiconductor (PMOS) or n-type Metal-Oxide-Semiconductor (NMOS).

Figure 2A:
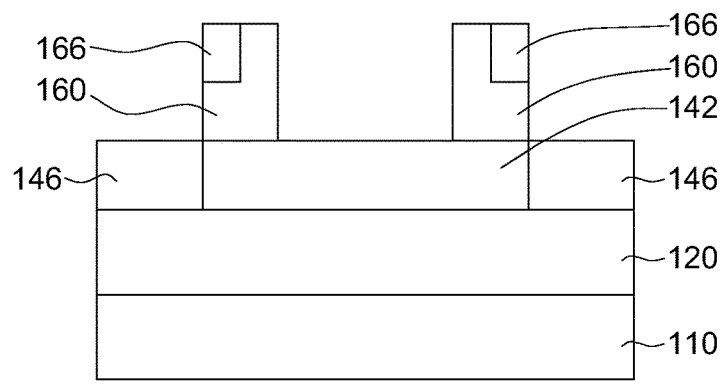
FIG. 2A illustrates a cross-sectional view of a semiconductor device taken along line A-A of FIG. 1.

FIG. 2A illustrates a cross-sectional view of a semiconductor device taken along line A-A of FIG. 1.

Referring to FIG. 1 and FIG. 2A together, after forming a silicon on insulator (SOI) layer formed of an insulating layer 120 and an active layer 142 on the substrate 110, a gate structure 160 can be formed on the SOI layer. After forming the gate structure 160, a contact region 160 can be formed on the SOI layer.

The substrate 110 can be a p-type silicon substrate. The insulating layer 120 can be a silicon oxide layer embedded between the substrate 110 and the active layer 142. The active layer 142 is disposed over the substrate 110, and can have a source region 142S and a drain region 142D. The source region 142S and the drain region 142D can be respectively doped with a dopant having a first type conductivity, such as p-type conductivity. The contact region 146 is disposed over the substrate 110, and doped with a dopant having a second type conductivity, such as n-type conductivity. The source region 142S and the drain region 142D have a type of the conductivity different from that of the contact region 146. The gate structure 160 is disposed over the active layer 142 and can be formed of poly-silicon, and has a thickness in a range of 50 nm-250 nm. There can be an oxide layer (not shown) disposed between the gate structure 160 and the active layer 142. That is, the oxide layer can be disposed on the active layer 142, and the gate structure 160 can be disposed on the oxide layer.

During forming the contact region, the active layer is doped with a dopant having a high concentration. If the contact region doped with the dopant in high concentration is too close to the middle portion of the gate structure, it may cause too much dopant diffusing to the working region of the gate structure and the performance of the semiconductor device can be affected. If the contact region having a dopant in high concentration is completely separated from the gate structure (i.e. the contact region is far away from the gate structure), the resistance of the substrate may be increased.

Referring to FIG. 1, the gate structure 160 includes a lateral portion 161 and a middle portion 162. The middle portion 162 corresponds to a channel region between the source region 142S and the drain region 142D. The middle portion 162 has a bar shape. The lateral portion 161 indicates the portion connecting to the middle portion. The middle portion 162 is formed between two lateral portions 161. The middle portion 162 has a width W1 along the X-direction, and has a length L1 along the Y-direction. The width W1 is in a range of 40 nm-500 nm. The length L1 is in a range of 0.5 μm-50 μm. The lateral portion 161 of the gate structure 160 has a snake shape, such as a zigzag pattern. Further, the lateral portion 161 and the middle portion 162 of the gate structure 160 together may not be formed as H shape or T shape. The lateral portion 161 of the gate structure 160 has at least one bending portion disposed on the active layer 142. The dopant of the contact region 146 may not diffuse to the middle portion 162 in a straight line, but may have to pass by the bending portions to reach the middle portion 162 (as shown in a diffusion path P of FIG. 1). Therefore, comparing to a comparison example having the lateral portion and the middle portion of the gate structure together formed as an H shape or a T shape, the semiconductor device of the present disclosure has a reduced diffusion margin between the gate structure 160 and the contact region 146, and the length of the diffusion path of the dopant is increased. Therefore, the concentration of the dopant, such as having the conductivity opposite to that of the source region 142S and the drain region 142D, diffusing to the middle portion 162 of the gate structure 160 can be largely diminished.

In the present embodiment, the lateral portion 161 of the gate structure 160 has a first portion 1611, a second portion 1612 connecting the first portion 1611, a third portion 1613 connecting the second portion 1612, a fourth portion 1614 connecting the third portion 1613, and a fifth portion 1615 connecting the fourth portion 1614. The third portion 1613 connects to the middle portion 162. The first portion 1611, the third portion 1612 and the fifth portion 1615 respectively extend in a first direction. The second portion 1612 and the fourth portion 1614 respectively extend in a second direction. The first direction is different from the second direction. In the present embodiment, the first direction is, for example, a X-direction, and the second direction is, for example, a Y-direction. The first direction and the second direction can be vertical to each other. But the present disclosure is not limited thereto, the first direction and the second direction can be not vertical to each other. In a top view of FIG. 1, the semiconductor device 100 has a center line Lc, and the semiconductor device 100 can be formed as a symmetrical structure of an upper portion and a lower portion along the center line Lc. In the present embodiment, the center line Lc extends along the X-direction (such as a horizontal direction). A first distance D1 is between the first portion 1611 and a center line Lc of the semiconductor device 100, a second distance D2 is between the third portion 1613 and the center line Lc of the semiconductor device 100, and the first distance D1 and the second distance D2 are different. More specifically, the first distance D1 is larger than the second distance D2. Since the first distance D1 and the second distance D2 are different, the gate structure 160 is not formed as the H shape or T shape. The concentration of the dopant diffusing to the middle portion 162 of the gate structure 160 can be reduced.

In the present embodiment, the gate structure 160 has four bending portions. A first bending portion 1601 is formed by the first portion 1611 and the second portion 1612. A second bending portion 1602 is formed by the second portion 1612 and the third portion 1613. A third bending portion 1603 is formed by the third portion 1613 and the fourth portion 1614. A fourth bending portion 1604 is formed by the fourth portion 1614 and the fifth portion 1615. Each of the angles of the bending portions can be 90°, but the present disclosure is not limited thererto.

Referring to FIG. 1 and FIG. 2A together, the contact region 146 and the gate structure 160 theoretically can be very close, but staggered to each other. However, during forming the contact region 146, a portion of the dopant may also be applied to the gate structure 160, and a corner portion 166 can be produced. The corner portion 166 can have a same type of conductivity to that of the contact region 146, such as both of the corner portion 166 and the contact region have n-type doped conductivity. The width W2 of the contact region 146 is in a range of 0.15 μm-1 μm. A distance D3 between the contact region 146 and the middle portion 162 of the gate structure 160 is in a range of 0.2 μm-1.5 μm. Since the distance between the contact region 146 and the gate structure 160 is very small, the resistance of the substrate 110 may not be increased.

Figure 2B:
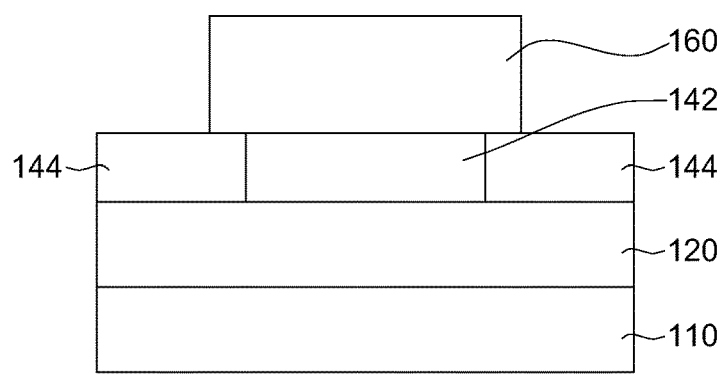
FIG. 2B illustrates a cross-sectional view of a semiconductor device taken along line B-B of FIG. 1.

FIG. 2B illustrates a cross-sectional view of a semiconductor device taken along line B-B of FIG. 1.

Referring to FIG. 1 and FIG. 2B together, an isolation region 144, such as Shallow Trench Isolation (STI), can be disposed over the substrate 110, and the isolation region 144 can extend outwardly from the inner portion of the active layer 142. The second portion 1612, the third portion 1613 and the fourth portion 1614 of the gate structure 160 can respectively correspond to one of three interfaces formed by the isolation region 144 and the active layer 142. In the top view of FIG. 1, since the isolation region 144 is formed in an inner portion of the active layer 142, the active layer 142 is not the rectangular shape, but the H shape. Comparing to a comparison example having the active layer in the rectangular shape, the active layer 142 having the H shape in the present disclosure can have fewer junction with the contact region 146, and the chance to have the dopant of the contact region 146 diffusing to the gate structure 160 may be decreased.

Figure 2C:
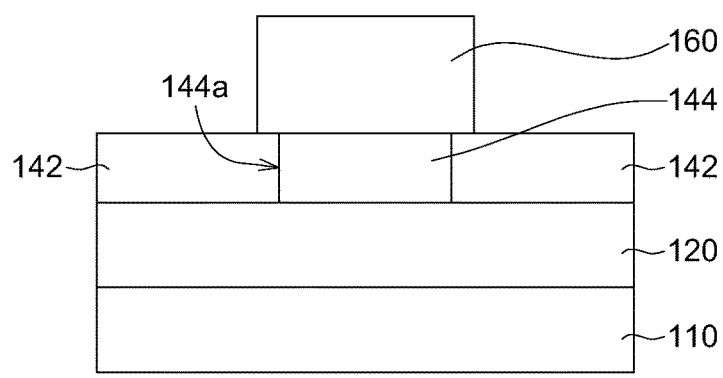
FIG. 2C illustrates a cross-sectional view of a semiconductor device taken along line C-C of FIG. 1.

FIG. 2C illustrates a cross-sectional view of a semiconductor device taken along line C-C of FIG. 1.

Referring to FIG. 1 and FIG. 2C together, the bending portions 1601, 1602, 1603, 1604 of the gate structure 160 are respectively disposed on the interface 144a between the active layer 142 and the isolation region 144 disposed over the substrate 110. The gate structure 160 covers a portion of the isolation region 144 and a portion of the active layer 142.

In the semiconductor of the present disclosure, the lateral portion of the gate structure has a snake shape. That is, the lateral portion of the gate structure and the middle portion together may not be formed as the H shape, I shape or T shape. The lateral portion of the gate structure has at least one bending portion disposed on the active layer. Therefore, the dopant of the contact region may not diffuse to the middle portion in a straight line, but pass by the bending portions to reach the middle portion. Comparing to the comparison example that the lateral portion and the middle portion of the gate structure are together formed as the H shape, I shape or T shape, the semiconductor device of the present disclosure can have a lower diffusion margin between the gate structure and the contact region, the length of the path for the dopant to diffuse to the gate structure can also be increased, so that the concentration of the dopant diffusing to the middle portion of the gate structure can be largely reduced. Additionally, even if the gate structure of the present disclosure has an increased diffusion path of the dopant, the area of the original circuit layout is not increased. The semiconductor device of the present disclosure can prevent the increase of the resistance of the substrate under a same or similar area of the circuit layout, the concentration of the dopant diffusing to the middle portion of the gate structure can be reduced, and the performance of the semiconductor device can be elevated.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a substrate;
   an active layer, disposed over the substrate and having a source region and a drain region;
   a contact region, disposed over the substrate;
   a gate structure, disposed over the active layer, wherein the gate structure comprises a middle portion and a lateral portion connecting to the middle portion, and the lateral portion has a snake shape,
   wherein the active layer is H-shaped.

2. The semiconductor device according to claim 1, wherein the lateral portion of the gate structure has four bending portions.

3. The semiconductor device according to claim 1, further comprising an isolation region, wherein the isolation region is disposed over the substrate, and extends outwardly from an inner portion of the active layer.

4. The semiconductor device according to claim 2, wherein each of the bending portions of the gate structure is disposed on an interface between the active layer and an isolation region on the substrate.

5. The semiconductor device according to claim 1, wherein the lateral portion of the gate structure has a corner portion, and the corner portion is doped with a dopant having a same type conductivity to the contact region.

6. The semiconductor device according to claim 1, wherein the source region has a first type conductivity, the drain region has the first type conductivity, and the contact region has a second type conductivity.

7. The semiconductor device according to claim 1, wherein the lateral portion of the gate structure has a first portion, a second portion, and a third portion, the second portion is disposed between the first portion and the third portion, the second portion connects to the first portion and the third portion, a first distance is between the first portion and a center line of the semiconductor device, a second distance is between the third portion and the center line of the semiconductor device, and the first distance and the second distance are different.

8. The semiconductor device according to claim 1, wherein the lateral portion of the gate structure has a first portion, a second portion connecting to the first portion, a third portion connecting to the second portion, a fourth portion connecting to the third portion, and a fifth portion connecting to the fourth portion,
   wherein third portion connects to the middle portion,
   the first portion, the third portion and the fifth portion respectively extend to a first direction,
   the second portion and the fourth portion respectively extend to a second direction, and the first direction is different from the second direction.

9. The semiconductor device according to claim 1, wherein the gate structure is formed of poly-silicon, and has a thickness in a range of 50-250 nm.

* * * * *